United States Patent
Moriya et al.

(10) Patent No.: US 11,754,642 B2
(45) Date of Patent: *Sep. 12, 2023

(54) MAGNETIC FIELD GENERATING UNIT, POSITION DETECTING DEVICE AND METHOD OF MANUFACTURING MAGNETIC FIELD GENERATING UNIT

(71) Applicant: TDK Corporation, Tokyo (JP)

(72) Inventors: Takahiro Moriya, Tokyo (JP); Toshio Ishikawara, Tokyo (JP); Toshihiko Oyama, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,883

(22) Filed: Oct. 26, 2022

(65) Prior Publication Data

US 2023/0053319 A1  Feb. 16, 2023

Related U.S. Application Data

(63) Continuation of application No. 16/747,159, filed on Jan. 20, 2020, now Pat. No. 11,506,727.

(30) Foreign Application Priority Data

Mar. 20, 2019  (JP) ................. 2019-052755

(51) Int. Cl.
*G01P 3/487* (2006.01)
*G01R 33/00* (2006.01)
(Continued)

(52) U.S. Cl.
CPC .... *G01R 33/0005* (2013.01); *B29C 45/14467* (2013.01); *G01P 3/487* (2013.01);
(Continued)

(58) Field of Classification Search
CPC ................. H01F 7/0221; H01F 7/0294; B29C 45/14467; G01P 3/487
See application file for complete search history.

(56) References Cited

U.S. PATENT DOCUMENTS 5,493,216 A  2/1996  Asa
6,580,265 B1  6/2003  Reichl et al.
(Continued)

FOREIGN PATENT DOCUMENTS

DE  102011107819 A1  1/2012
EP    2 843 371 A1   3/2015
(Continued)

OTHER PUBLICATIONS

Office action dated May 16, 2022 issued in corresponding DE Patent Application No. 102020103199.8 (and English translation).

*Primary Examiner* — Ramon M Barrera
(74) *Attorney, Agent, or Firm* — POSZ LAW GROUP, PLC

(57) ABSTRACT

Magnetic field generating unit is fixed to object that moves relative to magnetic field detecting means. Magnetic field generating unit has magnetic field generator, first support structure that is fixed to object and second support structure that is independent of first support structure. Second support structure is supported by first support structure and supports magnetic field generator. For example, second support structure is formed of a nonmagnetic material, and magnetic field generator is arranged away from first support structure.

12 Claims, 9 Drawing Sheets

(51) Int. Cl.
   *H01F 7/02*     (2006.01)
   *G01R 33/383*   (2006.01)
   *B29C 45/14*    (2006.01)

(52) U.S. Cl.
   CPC ......... *G01R 33/383* (2013.01); *H01F 7/0221* (2013.01); *H01F 7/0294* (2013.01)

(56) References Cited

U.S. PATENT DOCUMENTS

| | | |
|---|---|---|
| 7,847,446 B2 | 12/2010 | Becker et al. |
| 2014/0145564 A1 | 5/2014 | Taniguchi et al. |
| 2019/0232928 A1 | 8/2019 | Adachi et al. |

FOREIGN PATENT DOCUMENTS

| | | |
|---|---|---|
| JP | 2002-542474 A | 12/2002 |
| JP | 2012-220481 A | 11/2012 |
| JP | 2013-088134 A | 5/2013 |
| JP | 2013-096723 A | 5/2013 |
| JP | 2015-045507 A | 3/2015 |

MAGNETIC FIELD GENERATING UNIT, POSITION DETECTING DEVICE AND METHOD OF MANUFACTURING MAGNETIC FIELD GENERATING UNIT

The present application is a continuation application of U.S. application Ser. No. 16/747,159 filed on Jan. 20, 2020, which is based on, and claims priority from, JP Application No. 2019-52755, filed on Mar. 20, 2019, the disclosures of which are hereby incorporated by reference.

BACKGROUND OF THE INVENTION

Field of the Invention

The present invention relates to a magnetic field generating unit, a position detecting device using the same, and a method of manufacturing the magnetic field generating unit, particularly to the support structure for the magnetic field generator of a magnetic field generating unit.

Description of the Related Art

Position detecting devices for detecting the position of an object that moves linearly are known. JP2013-96723A discloses a position detecting device having a magnetic field detecting means and two magnets. The magnets are supported by a support unit that moves linearly and that are movable relative to the magnetic field detecting means. Due to the movement of the two magnets relative to the magnetic field detecting means, a magnetic field that is detected by the magnetic field detecting means changes. Based on the change of the magnetic field, the positions of the two magnets relative to the magnetic field detection means, i.e. the position of the object, are detected.

SUMMARY OF THE INVENTION

A magnetic field generator, such as a magnet, may be indirectly supported by an object via a support structure that is fixed to the object. A magnetic field generating unit, which is an assembly of the support structure and the magnetic field generator, is usually incorporated in and used with a mechanical device. As a result, the support structure may have a complicated shape in order to prevent interference between the magnetic field generator and the mechanical device or to ensure a distance between the magnetic field generator and other magnetic materials. The support structure is made, for example, by sheet metal processing or by forging, but if the shape is complicated, then the cost and steps for manufacturing the magnetic field generating unit are increased.

The present invention aims at providing a magnetic field generating unit that can be accurately manufactured at low cost even if it has a complicated shape.

A magnetic field generating unit of the present invention is fixed to an object that moves relative to magnetic field detecting means. The magnetic field generating unit comprises: a magnetic field generator; a first support structure that is fixed to the object; and a second support structure that is independent of the first support structure. The second support structure is supported by the first support structure and supports the magnetic field generator.

Since the magnetic field generator is supported by the object via the first support structure and the second support structure that are independent of each other, the shapes of the first support structure and the second support structure can be simplified. Therefore, according to the present invention, it is possible to provide a magnetic field generating unit that can be accurately manufactured at low cost even if it has a complicated shape.

The above and other objects, features and advantages of the present invention will become apparent from the following description with reference to the accompanying drawings which illustrate examples of the present invention.

DETAILED DESCRIPTION OF THE INVENTION

Figure 1:
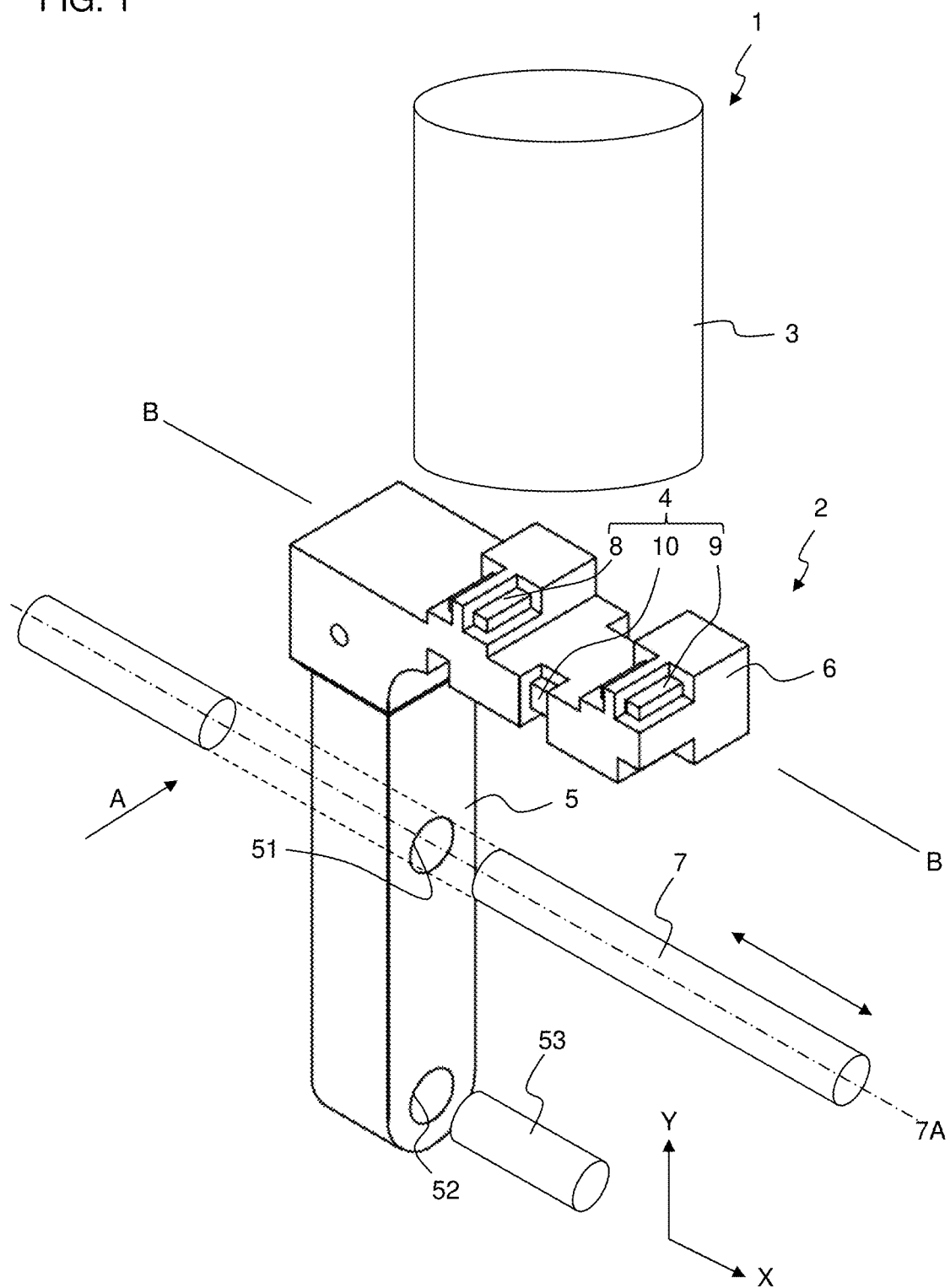
FIG. 1 is a perspective view of a position detecting device according to a first embodiment of the present invention.
Figure 2A:
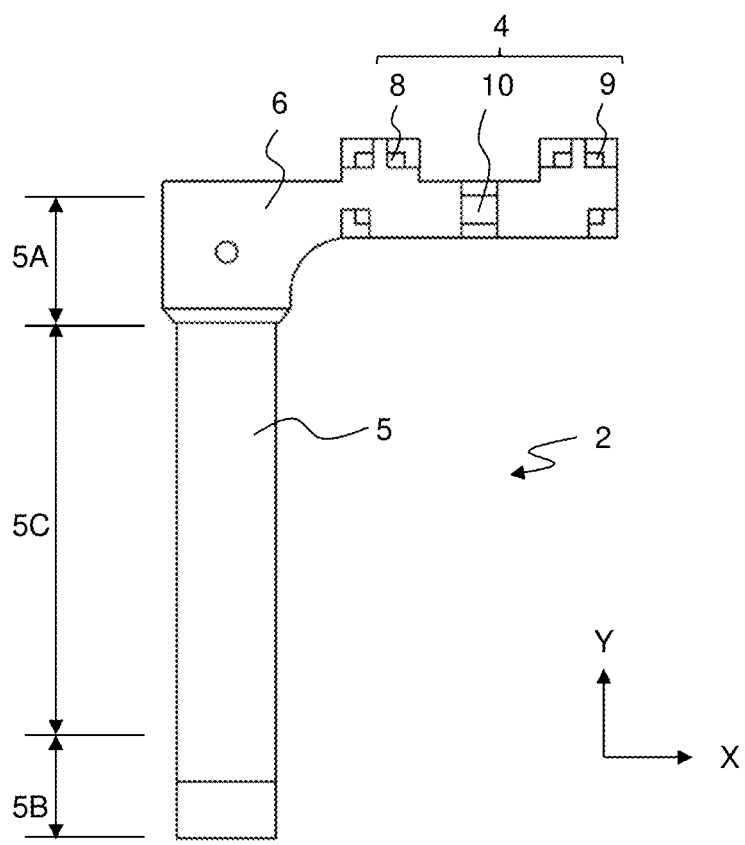
FIG. 2A is a side view of the magnetic field generating unit of the position detecting device shown in FIG. 1.
Figure 2B:
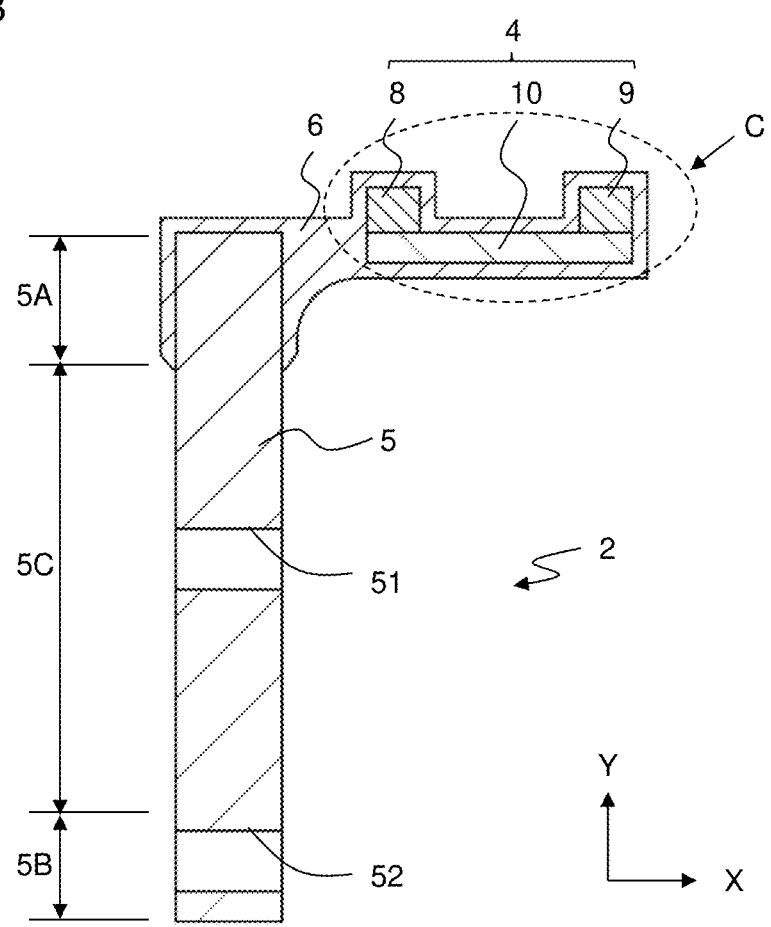
FIG. 2B is a cross-sectional view of the magnetic field generating unit of the position detecting device shown in FIG. 1.

Hereinafter, embodiments of the present invention will be described with reference to the drawings. FIG. 1 is a perspective view of a position detecting device. FIG. 2A is a side view of the magnetic field generating unit, as seen from direction A in FIG. 1, and FIG. 2B is a cross-sectional view of the magnetic field generating unit taken along line B-B in FIG. 1. The X direction is the longitudinal direction of second support structure 6, a direction in which first magnet 8 and second magnet 9 are arranged, and the longitudinal direction of yoke 10. The Y direction is the longitudinal direction of first support structure 5 and is orthogonal to the X direction. Position detecting device 1 has magnetic field generating unit 2 and magnetic field detecting means 3. Magnetic field generating unit 2 is fixed to an object whose position is to be detected (hereinafter referred to as object 7) that moves relative to magnetic field detecting means 3. In the present embodiment, magnetic field detecting means 3 is fixed to a stationary structure, not shown, and magnetic field generating unit 2 is fixed to object 7 that moves relative to the stationary structure. However, magnetic field generating unit 2 may be fixed to a stationary structure and magnetic field detecting means 3 may be fixed to object 7 that moves relative to the stationary structure.

Magnetic field generating unit 2 has magnetic field generator 4, first support structure 5 and second support structure 6. First support structure 5 is fixed to object 7. Second support structure 6 is, on one hand, supported by first support structure 5 and, on the other, supports magnetic field generator 4. Second support structure 6 is an element that is different from, or independent of, first support structure 5. Magnetic field generator 4 is arranged away from first support structure 5. First support structure 5 has an elongate shape in the Y direction, second support structure 6 has an elongate shape in the X direction, and second support structure 6 is supported by first support structure 5 at an end portion of second support structure 6 with regard to longitudinal direction Y. Since first support structure 5 and second support structure 6 have a generally L-shape, it is easy to mount magnetic field generator 4 at a position remote from object 7 while avoiding interference with other structures.

Object 7 moves linearly in the X direction. In this embodiment, object 7 is shaft 7 that moves linearly along central axial 7A. First support structure 5 has first hole 51 through which shaft 7 passes, as well as second hole 52 for positioning. Second hole 52 is aligned with a hole of a structure, not shown, that moves together with shaft 7. Cylindrical fixing member 53 is inserted into these holes. First support structure 5 is fixed to shaft 7 such that first support structure 5 is prevented from rotating relative to shaft 7 and from moving in the X direction relative to shaft 7. In this way, magnetic field generating unit 2 is supported by object 7 that is movable, and moves in the X direction along with object 7 relative to magnetic field detecting means 3 that is fixed.

Figure 3:
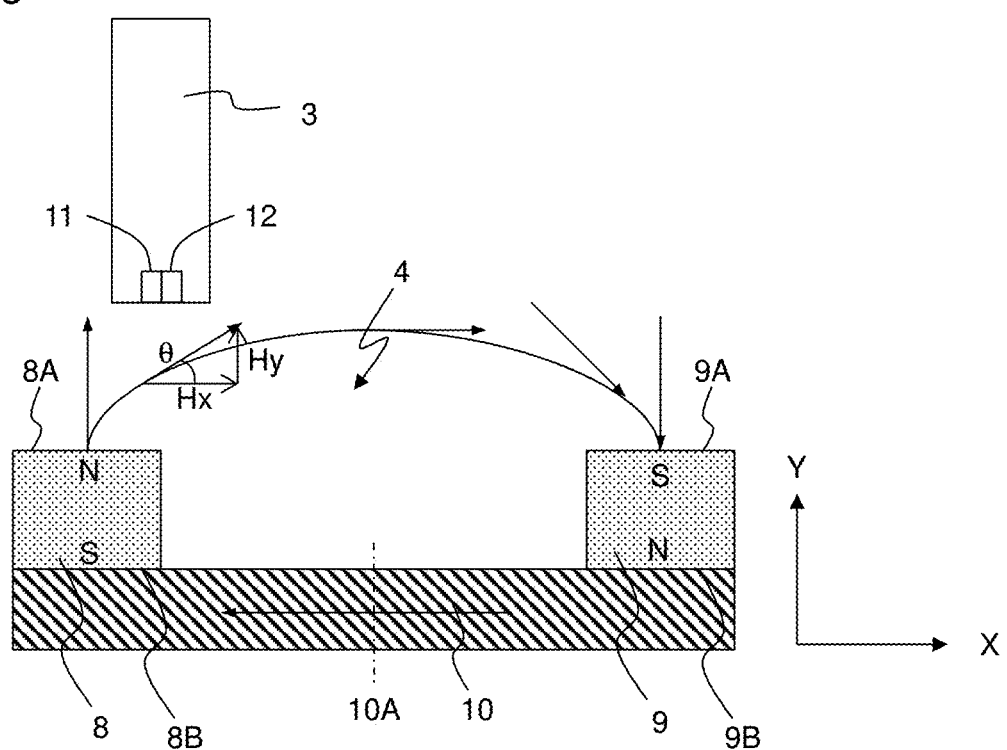
FIG. 3 is an enlarged view of the magnetic field generator and the magnetic field detecting means of the position detecting device shown in FIG. 1.

FIG. 3 is an enlarged view of portion C in FIG. 2B, showing magnetic field generator 4 and magnetic field detecting means 3. Magnetic field generator 4 includes first magnet 8, second magnet 9 and yoke 10. First and second magnets 8, 9 are generally rectangular parallelepiped-shaped, and have first and second surfaces 8A, 9A that face magnetic field detecting means 3, as well as back surfaces of first and second surfaces 8A, 9A (hereinafter referred to as first and second back surfaces 8B, 9B), respectively. Yoke 10 is fixed to first and second magnets 8, 9 on first and second back surfaces 8B, 9B, respectively. First surface 8A and second surface 9A have different polarities. For example, when first surface 8A is the N-pole, second surface 9A is the S-pole. Yoke 10 is an elongated metallic plate that is made of a soft magnetic material, such as NiFe. Yoke 10 controls the flow of magnetic flux such that the magnetic flux that exits second back surface 9B (the N pole) of second magnet 9 efficiently enters first back surface 8B (the S pole) of first magnet 8. Yoke 10 can downsize first magnet 8 and second magnet 9. First magnet 8 and second magnet 9 have substantially the same shape and size, and are made of the same material. First surface 8A and second surface 9A are positioned in the same plane, and first and second magnets 8, 9 are provided at positions equidistant from center 10A of yoke 10 with regard to longitudinal direction X of yoke 10. That is, magnetic field generator 4 is formed to be symmetrical. For this reason, magnetic flux that exits first surface 8A and that enters second surface 9A forms a substantially sinusoidal shape at positions where the magnetic flux is away from first and second magnets 8, 9 in the Y direction.

Magnetic field detecting means 3 has first magnetic field detecting element 11 and second magnetic field detecting element 12. First magnetic field detecting element 11 detects the X-direction component of a magnetic field that is parallel to first and second surfaces 8A, 9A and that is also parallel to the direction in which first magnet 8 and second magnet 9 are arranged. Second magnetic field detecting element 12 detects the Y-direction component of a magnetic field that is perpendicular to first and second surfaces 8A, 9A. First and second magnetic field detecting elements 11, 12 are Hall elements, but may be magnetoresistive effect elements, such as AMR, GMR and TMR elements. By calculating arc tan (Hy/Hx) from the magnetic field component Hx in the X direction that is detected by first magnetic field detecting element 11 and the magnetic field component Hy in the Y direction that is detected by second magnetic field detecting element 12, angle θ of the magnetic field with respect to the X direction in the X-Y plane can be obtained. From angle θ of the magnetic field, it is possible to determine the positions of first and second magnets 8, 9, i.e. the position of object 7, in the X direction relative to magnetic field detecting means 3.

Referring again to FIGS. 1, 2A and 2B, in the present embodiment, second support structure 6 is formed of a resin that is bonded both to first support structure 5 and to magnetic field generator 4. First end region 5A of first support structure 5 on the side of magnetic field generator 4 is covered with the resin, while second end region 5B on the side opposite to first end region 5A and intermediate region 5C between first end region 5A and second end region 5B are not covered with the resin. Second support structure 6 is a resin that is made by injection molding. The resin only covers a part of magnetic field generator 4, and exposes first surface 8A of first magnet 8 and second surface 9A of second magnet 9. As a result, the amount of resin can be reduced. The resin may or may not contain filler, but when it contains filler, the filler is preferably formed of a nonmagnetic material. In other words, second support structure 6 is preferably formed of a nonmagnetic material. As described above, the magnetic flux that is formed between first magnet 8 and second magnet 9 forms a substantially sinusoidal shape. However, if second support structure 6 is formed of a magnetic material, then the magnetic flux is disturbed, causes Hx and Hy to fluctuate, and worsens the accuracy in detecting the position. In other words, in order to ensure the accuracy in detecting the position, it is preferable that the magnetic field, which is generated by magnetic field generator 4, not be affected by the surrounding structures. This means that it is preferable that no magnetic material be present in the vicinity of magnetic field generator 4. Conventionally, the support structure is typically formed of a magnetic material, such as iron, and the support structure also serves as a yoke. As a result, the magnetic field that is generated by magnetic field generator 4 is easily disturbed by the support structure. In the present embodiment, since magnetic field generator 4 is magnetically isolated from other magnetic materials or is magnetically floating, it is easy to ensure the accuracy in detecting the position.

In addition, conventionally, since the support structure and the yoke are formed as an integral member, the integral member needs to function as the yoke and to function as the support structure. Thus, the selection of the material is limited. When having the integral member function as a yoke is prioritized, it is necessary to have all parts of the member made from a magnetic material, such as iron, but the above-mentioned problem occurs. On the other hand, it is disadvantageous in terms of cost to make an L-shaped support structure from a nonmagnetic material, such as aluminum, because the material is costly and it is also costly to form the support structure into a desired shape. Further, it is necessary to provide a yoke that is made of a soft magnetic material and that is independent of the support structure or to increase the size of first magnet 8 and second magnet 9. In the present embodiment, suitable materials can be selected both for first support structure 5 and for yoke 10, and, in addition, first magnet 8 and second magnet 9 can be downsized.

First support structure 5 is made of iron. Since first support structure 5 is an elongate element, such as a rod or an elongate plate, it can be manufactured at low cost. Since first support structure 5 is remote from magnetic field generator 4, the magnetic influence of first support structure 5 on magnetic field generator 4 is limited. First support structure 5 may be formed of a nonmagnetic material, such as aluminum or a resin. By doing so, first support structure 5 does not exert any influence on magnetic field generator 4 from, and the position can still be detected more accurately.

Figure 4A:
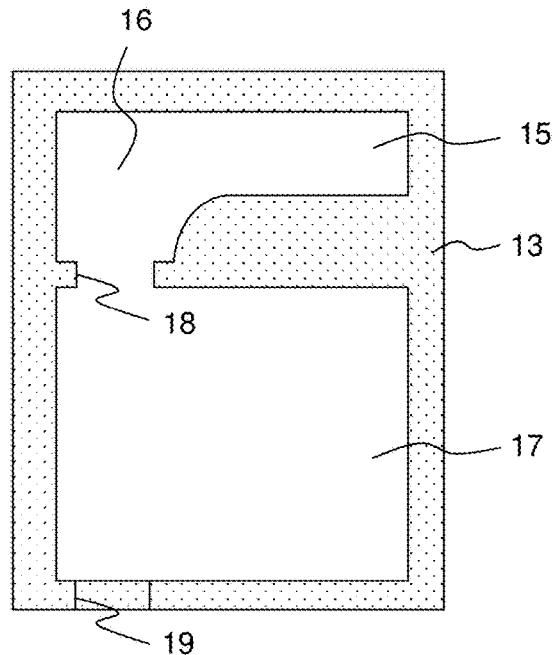
FIGS. 4A to 5B are views showing a manufacturing method of the magnetic field generating unit.

Next, a method of manufacturing magnetic field generating unit 2 will be described. First, as shown in FIG. 4A, lower mold 13 for injection molding is prepared. Lower mold 13 has first concave portion 15 for arranging magnetic field generator 4 (first and second magnets 8, 9 and yoke 10), second concave portion 16 for arranging first end region 5A of first support structure 5 and third concave portion 17 that is adjacent to second concave portion 16 for arranging intermediate region 5C of first support structure 5. First and second concave portions 15, 16 are one continuous concave portion, and shutoff portion 18 that defines the region where a resin is charged is formed between second concave portion 16 and third concave portion 17. At the end of third concave portion 17 that is opposite to second concave portion 16, recess 19 for holding second end region 5B is formed.

Figure 4B:
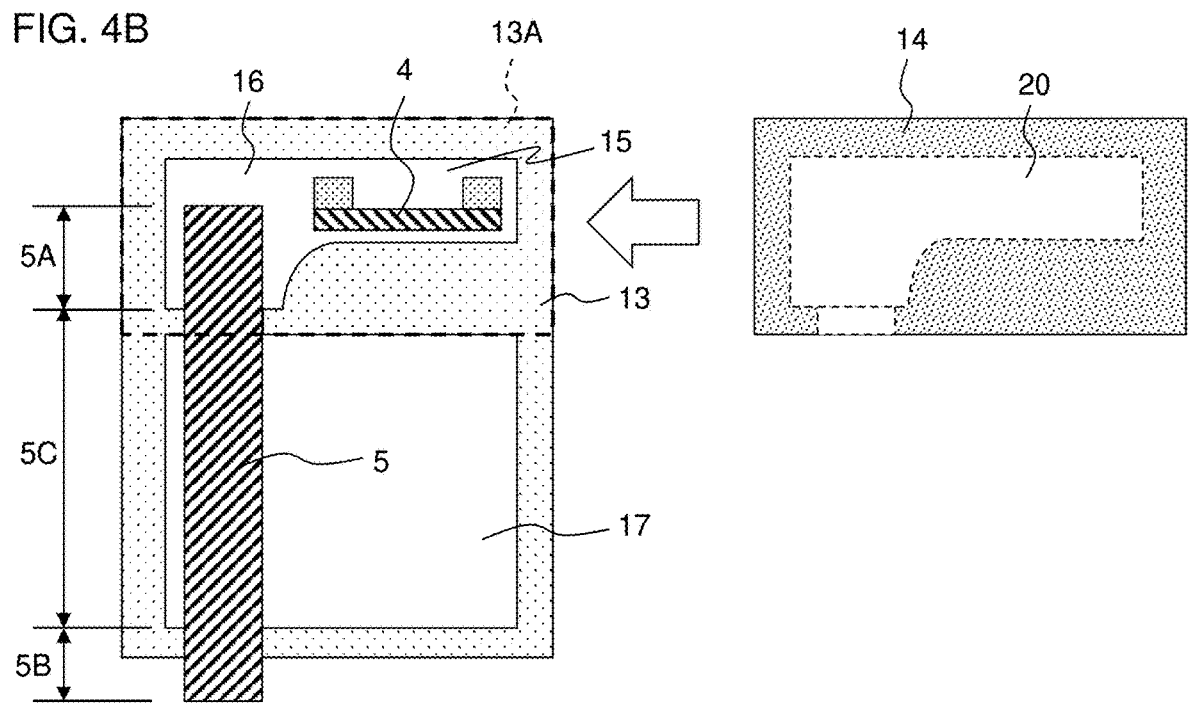
Figure 5A:
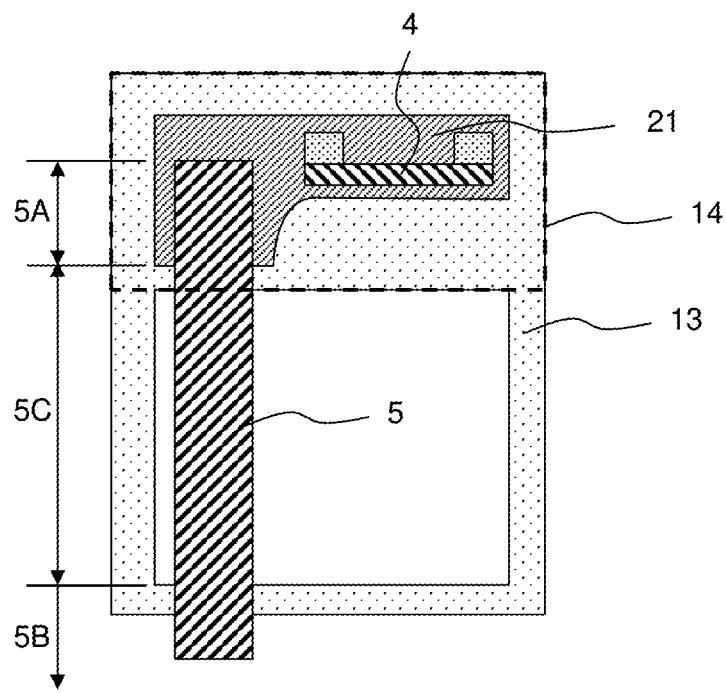
Figure 5B:
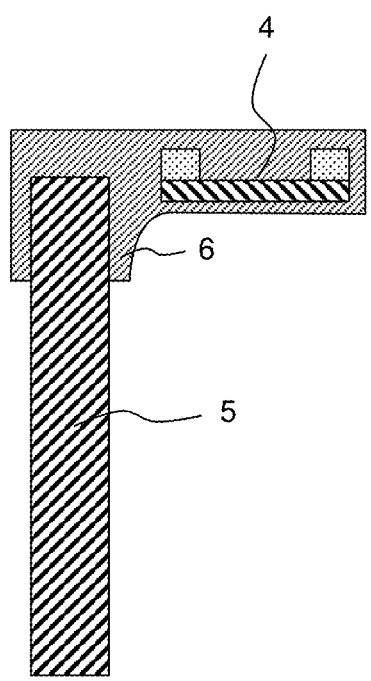

Next, as shown in FIG. 4B, magnetic field generator 4 is arranged in first concave portion 15, first end region 5A of first support structure 5 is arranged in second concave portion 16, and intermediate region 5C of first support structure 5 is arranged in third concave portion 17. Magnetic field generator 4 and first support structure 5 are arranged away from each other. Although not shown, first concave portion 15 and second concave portion 16 are provided with holding means for supporting magnetic field generator 4 and first support structure 5, respectively. Next, upper mold 14 is placed on lower mold 13 in which magnetic field generator 4 and first support structure 5 are arranged. Upper mold 14 is provided in region 13A that corresponds to first and second concave portions 15, 16. Upper mold 14 has fourth concave portion 20 that faces first and second concave portions 15, 16. As shown in FIG. 5A, the space that is formed by first and second concave portions 15, 16 and fourth concave portion 20 is filled with resin 21. Thereafter, resin 21 is cured, and as shown in FIG. 5B, upper mold 14 is removed in order to take out magnetic field generator 4, first support structure 5 and resin 21 that has been cured from lower mold 13. Resin 21 that has been charged and cured is, on one hand, supported by first support structure 5, and, on the other, serves as nonmagnetic second support structure 6 that supports magnetic field generator 4. The shape of second support structure 6 depends on magnetic field generating unit 2, but first end region 5A of first support structure 5 and magnetic field generator 4 can be standardized. Therefore, it is possible to produce various shapes of magnetic field generating units 2 just by changing lower mold 13 and upper mold 14.

Figure 6A:
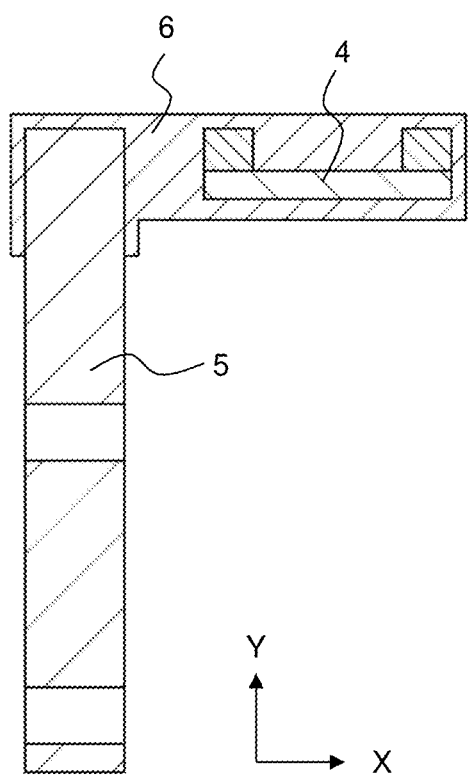
FIGS. 6A to 6D are cross-sectional views of magnetic field generating units according to other embodiments of the present invention.
Figure 6B:
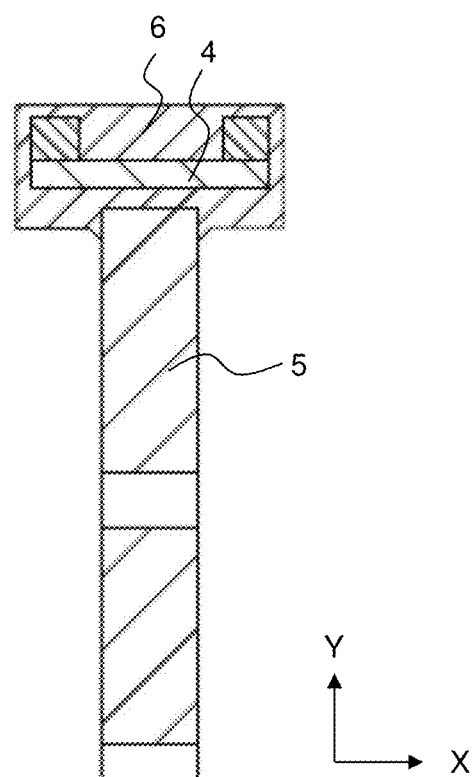
Figure 6C:
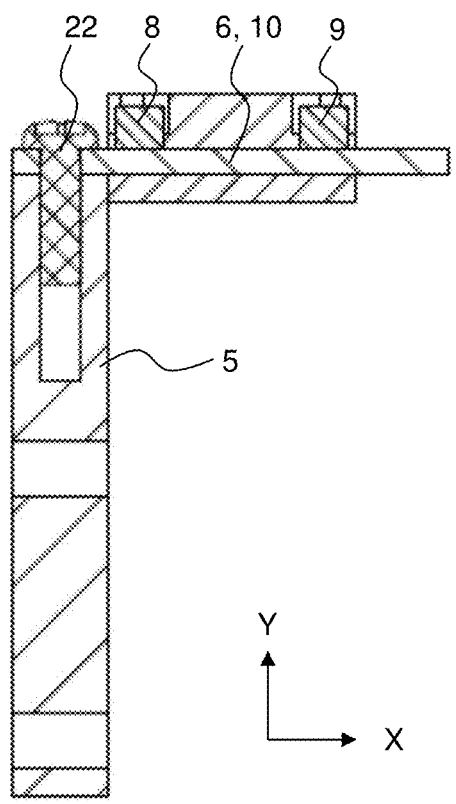
Figure 6D:
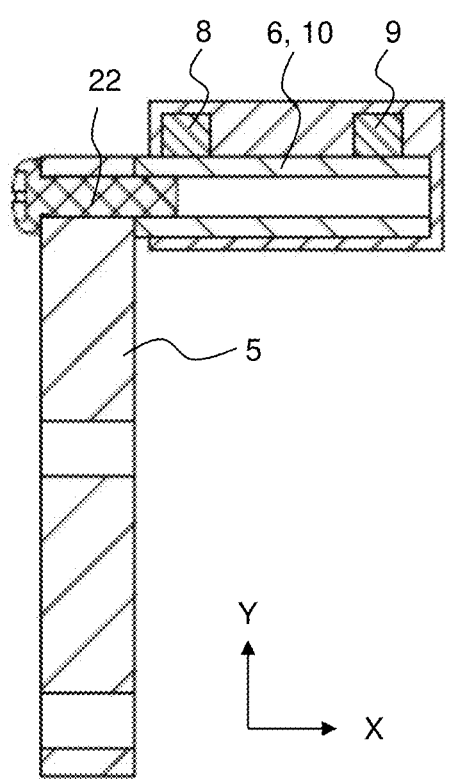

FIGS. 6A to 6D show other embodiments of the present invention. Referring to FIG. 6A, the resin may cover the entire surface of magnetic field generator 4. In this embodiment, first and second magnets 8, 9 and yoke 10 can be protected from the environment. Referring to FIG. 6B, first and second support structures 5, 6 have elongated shapes, and second support structure 6 is supported by first support structure 5 at an intermediate position of second support structure 6 with regard to longitudinal direction X. Depending on the relative positions of magnetic field generator 4 and object 7, this embodiment may be used as an alternative to the embodiment shown in FIGS. 1, 2A, 2B. Referring to FIGS. 6C and 6D, second support structure 6 also serves as yoke 10 and is fixed to first support structure 5 by means of screws 22, which is bonding means. In the example shown in FIG. 6C, screw 22 extends in longitudinal direction Y of first support structure 5 in order to fix second support structure 6 to first support structure 5. In the example shown in FIG. 6D, screw 22 extends in direction X, which is orthogonal to longitudinal direction Y of first support structure 5, in order to fix second support structure 6 to first support structure 5. The position can be detected more accurately by forming first support structure 5 and screw 22 from a nonmagnetic material. The bonding means for bonding second support structure 6 to first support structure 5 is not limited to screw 22 and may be an adhesive.

Figure 7A:
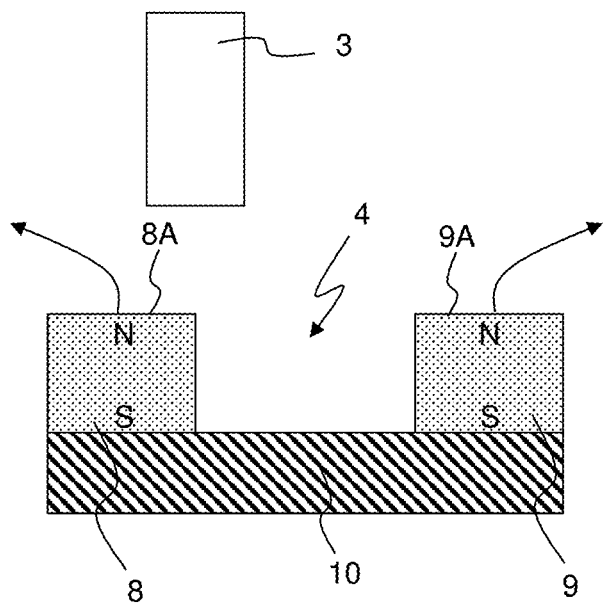
FIGS. 7A to 7C are cross-sectional views of magnetic field generators according to other embodiments of the present invention.
Figure 7C:
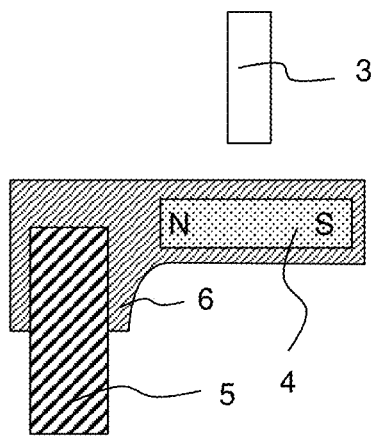
Figure 7B:
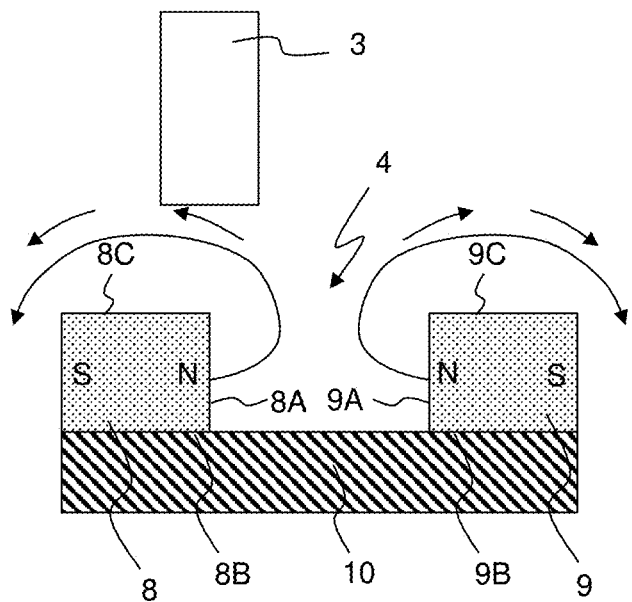

FIGS. 7A to 7C show other embodiments of the present invention. In these embodiments, the configurations of magnetic field generators 4 are different from those of the embodiments mentioned above. Referring to FIG. 7A, first surface 8A of first magnet 8 and second surface 9A of second magnet 9 face in the same direction, but unlike FIG. 3, they have the same polarity (the N pole or the S pole). Referring to FIG. 7B, first surface 8A of first magnet 8 and second surface 9A of second magnet 9 face each other, and have the same polarity (the N pole or the S pole). First magnet 8 and second magnet 9 are fixed to yoke 10 on third surface 8B adjacent to first surface 8A and on fourth surface 9B adjacent to second surface 9A, respectively, and back surface 8C of third surface 8B and back surface 9C of fourth surface 9B face magnetic field detecting means 3. In these embodiments, since first surface 8A and second surface 9A have the same polarity, the magnetic flux lines are formed such that they extend away from each other. However, in the same manner as the embodiment in FIG. 3, it is possible to determine the position of object 7 relative to magnetic field detecting means 3 in the X direction based on Hx and Hy. Further, as shown in FIG. 7C, magnetic field generator 4 may be formed of a single magnet in order to omit the yoke. Although the size of the magnet is increased, as compared to the other embodiments, the configuration of magnetic field generator 4 can be simplified.

Although certain preferred embodiments of the present invention have been shown and described in detail, it should be understood that various changes and modifications may be made without departing from the spirit or scope of the appended claims.

What is claimed is:

1. A magnetic field generating unit that is fixed to an object that moves relative to magnetic field detecting means comprising:
   a magnetic field generator;
   a first support structure that is fixed to the object; and
   a second support structure that is independent of the first support structure, wherein the second support structure is supported by the first support structure and supports the magnetic field generator,
   wherein the first support structure is elongate in a first direction, the second support structure is elongate in a second direction that is orthogonal to the first direction, and the second support structure is formed of a resin that is bonded both to the first support structure and to the magnetic field generator.

2. The magnetic field generating unit according to claim 1, wherein
   the second support structure is formed of a nonmagnetic material,
   the magnetic field generator is arranged away from the first support structure, and
   the first support structure is formed of a nonmagnetic material.

3. The magnetic field generating unit according to claim 1, further comprising bonding means for bonding the second support structure to the first support structure, wherein the second support structure is formed of a nonmagnetic material, the magnetic field generator is arranged away from the first support structure, and the bonding means is formed of a nonmagnetic material.

4. The magnetic field generating unit according to claim 1, wherein the magnetic field generator includes:

a first magnet having a first surface that faces the magnetic field detecting means, a second magnet having a second surface that faces the magnetic field detecting means; and an elongate yoke that is fixed to the first and second magnets on back surfaces of the first and second surfaces, respectively, and that is made of a soft magnetic material, wherein the first and second magnets are positioned equidistant from a center of the yoke with regard to a longitudinal direction thereof.

5. The magnetic field generating unit according to claim 4, wherein the second surface has a polarity that is different from a polarity of the first surface.

6. The magnetic field generating unit according to claim 1, wherein the magnetic field generator includes:

a first magnet having a first surface, a second magnet having a second surface that faces the first surface and that has a same polarity as the first surface, and an elongate yoke that is fixed to the first and second magnets on surfaces adjacent to the first and second surfaces, respectively, and that is made of a soft magnetic material, wherein the first and second magnets are positioned equidistant from a center of the yoke with regard to a longitudinal direction thereof.

7. The magnetic field generating unit according to claim 1, wherein the first and second support structures have elongate shapes, and the second support structure is supported by the first support structure at an intermediate position of the second support structure with regard to a longitudinal direction thereof.

8. The magnetic field generating unit according to claim 1, wherein the first and second support structures have elongate shapes, and the second support structure is supported by the first support structure at an end of the second support structure with regard to a longitudinal direction thereof.

9. A position detecting device comprising:

the magnetic field generating unit according to claim 1 that is fixed to an object that moves linearly; and magnetic field detecting means for detecting a magnetic field that is generated by the magnetic field generating unit.

10. The magnetic field generating unit according to claim 1, wherein the object moves linearly, the first support structure is elongate in a direction orthogonal to a direction in which the object moves, and the second support structure is fixed to the first support structure at an end of the first support structure.

11. The magnetic field generating unit according to claim 1, wherein the object moves linearly, and the first support structure moves linearly with the object.

12. A method of manufacturing a magnetic field generating unit that is fixed to an object that moves relative to magnetic field detecting means, the method comprising the steps of:

arranging a magnetic field generator and a first support structure that is fixed to the object in a mold such that the magnetic field generator is arranged away from the first support structure; and filling the mold with a resin and forming a second support structure from the resin, wherein the second support structure is independent of the first support structure, the second support structure is supported by the first support structure and supports the magnetic field generator, wherein the first support structure is elongate in a first direction, the second support structure is elongate in a second direction that is orthogonal to the first direction, and the second support structure is bonded both to the first support structure and to the magnetic field generator.

* * * * *